US009976045B2

(12) United States Patent
Jing et al.

(10) Patent No.: US 9,976,045 B2
(45) Date of Patent: May 22, 2018

(54) FLUOROPOLYMER COATINGS COMPRISING AZIRIDINE COMPOUNDS

(71) Applicant: 3M INNOVATIVE PROPERTIES COMPANY, St. Paul, MN (US)

(72) Inventors: Naiyong Jing, Woodbury, MN (US); Kai H. Lochhaas, Neuotting (DE); Kevin M. Hamer, St. Paul, MN (US); Thomas J. Blong, Woodbury, MN (US); Timothy D. Fletcher, Lino Lakes, MN (US); Zhigang Yu, Shanghai (CN); Michael Juergens, Moenchengladbach (DE)

(73) Assignee: 3M Innovative Properties Company, St. Paul, MN (US)

( * ) Notice: Subject to any disclaimer, the term of this patent is extended or adjusted under 35 U.S.C. 154(b) by 22 days.

(21) Appl. No.: 14/911,852

(22) PCT Filed: Nov. 7, 2013

(86) PCT No.: PCT/CN2013/086680
§ 371 (c)(1),
(2) Date: Feb. 12, 2016

(87) PCT Pub. No.: WO2015/066868
PCT Pub. Date: May 14, 2015

(65) Prior Publication Data
US 2016/0237299 A1    Aug. 18, 2016

(51) Int. Cl.
*C08K 5/3412* (2006.01)
*C09D 127/22* (2006.01)
*H01L 31/049* (2014.01)
*C08K 3/22* (2006.01)
*C08K 3/34* (2006.01)
*C08K 3/36* (2006.01)
*C09D 7/12* (2006.01)

(52) U.S. Cl.
CPC .............. *C09D 127/22* (2013.01); *C08K 3/22* (2013.01); *C08K 3/346* (2013.01); *C08K 3/36* (2013.01); *C08K 5/3412* (2013.01); *C09D 7/1216* (2013.01); *H01L 31/049* (2014.12); *C08K 2003/2241* (2013.01)

(58) Field of Classification Search
CPC ................................ C08K 3/36; C08K 5/3412
See application file for complete search history.

(56) References Cited

U.S. PATENT DOCUMENTS

| | | | |
|---|---|---|---|
| 3,235,544 A | 2/1966 | Christena |
| 3,243,429 A | 3/1966 | Ham |
| 4,152,165 A | 5/1979 | Langager |
| 4,338,377 A | 7/1982 | Beck |
| 5,073,404 A | 12/1991 | Huang |
| 5,126,394 A | 6/1992 | Revis |
| 5,221,497 A | 6/1993 | Watanabe |
| 5,597,512 A | 1/1997 | Watanabe |
| 5,880,204 A | 3/1999 | McCarthy |
| 6,943,228 B2 | 9/2005 | Grootaert |
| 7,323,514 B2 | 1/2008 | Jing |
| 7,351,471 B2 | 4/2008 | Jing |
| 8,017,666 B2 | 9/2011 | Bissinger |
| 8,025,928 B2 | 9/2011 | Snow |
| 8,048,518 B2 | 11/2011 | Debergalis |
| 9,221,990 B2 | 12/2015 | Jing |
| 9,577,206 B2 | 2/2017 | Yamae |
| 2006/0054053 A1 | 3/2006 | Masutani |
| 2006/0147177 A1 | 7/2006 | Jing |
| 2006/0148996 A1 | 7/2006 | Coggio |
| 2008/0319122 A1 | 12/2008 | Filiatrault |
| 2011/0034604 A1 | 2/2011 | Hintzer |
| 2011/0086954 A1 | 4/2011 | Snow |
| 2011/0251332 A1 | 10/2011 | Allen |
| 2014/0318617 A1 | 10/2014 | Nakagawa |

FOREIGN PATENT DOCUMENTS

| | | |
|---|---|---|
| CN | 1637087 | 7/2005 |
| CN | 102746754 | 10/2012 |
| CN | 103275570 | 9/2013 |

(Continued)

OTHER PUBLICATIONS

Machine translation of JP 2001-072819, Mar. 2001.*
XAMA 7 product information sheet, Nov. 2004.*
Database WPI, Week 201355, Thomson Scientific, London, GB; AN 2012-K51284, XP002734101, & KR 2012 0086225 A (Toray Aovanceo Materials Korea Inc), Aug. 2, 2012 (Aug. 2, 2012).
Database WPI, Week 201355, Thomson Scientific, London, GB; AN 2012-K51279, XP002734102, & KR 2012 0086226 A (Toray Aovanceo Materials Korea Inc) Aug. 2, 2012 (Aug. 2, 2012).
Database WPI, Week 200134, Thomson Scientific, London, GB; AN 2001-321263 XP002734103, & JP 2001 072819 A (Daikin Kogyo KK) Mar. 21, 2001 (Mar. 21, 2001).

(Continued)

*Primary Examiner* — Peter D. Mulcahy
(74) *Attorney, Agent, or Firm* — Carolyn A. Fischer

(57) ABSTRACT

A fluoropolymer coating composition is described comprising an aqueous liquid medium, fluoropolymer particles dispersed in the aqueous liquid medium, and at least one aziridine compound. The aziridine compound comprises at least two aziridine groups (i.e. polyaziridine) or at least one aziridine group and at least one alkoxy silane group.

In another embodiment, an article is described comprising a substrate wherein a surface of the substrate comprises a coating comprising fluoropolymer particles; and a reaction product of at least one aziridine compound comprising at least two aziridine groups or at least one aziridine group and at least one alkoxy silane group. The coating can be utilized as a primer for bonding a non-fluorinated substrate to a fluoropolymer film and/or the coating can be used as an (e.g. outer exposed) surface layer. In some embodiments, the article may be the (e.g. backside) film of a photovoltaic module.

14 Claims, No Drawings

(56) References Cited

FOREIGN PATENT DOCUMENTS

| JP | H10-204253 | 8/1998 |
| JP | 2001-072819 | 3/2001 |
| JP | 2010045376 | 9/2009 |
| JP | 2010-238759 | 10/2010 |
| JP | 2013082925 | 5/2013 |
| KR | 2012-0086225 | 8/2012 |
| KR | 2012-0086226 | 8/2012 |
| WO | WO 20061691 | 1/2006 |
| WO | WO 2006-073785 | 7/2006 |
| WO | WO 2006-073918 | 7/2006 |
| WO | WO 2006-083425 | 8/2006 |
| WO | WO 2007-108905 | 9/2007 |
| WO | WO 2008-133848 | 11/2008 |
| WO | WO 2008-156978 | 12/2008 |
| WO | WO 2010-051149 | 5/2010 |
| WO | WO 2011-131547 | 10/2011 |
| WO | WO 2013-089926 | 6/2013 |
| WO | WO 2015-066868 | 5/2015 |
| WO | WO 2015-069502 | 5/2015 |

OTHER PUBLICATIONS

Database CA [Online] Chemical Abstracts Service, Columbus, Ohio, US; Imoto, Katsuhiko et al: "Room temperature-curable water-based fluoropolymer coating compositions", retrieved from STN Database accession No. 2005:100331 O ; & JP 2005 248157 A (Daikin Ind Ltd) Sep. 15, 2005 (Sep. 15, 2005).
3M, Dyneon, Fluoroplastic THV 340Z, Dyneon Product Catalogue, 1 pg.
3M, Dyneon, Fluoroplastic THV 340Z, Preliminary Technical Information, 2 pgs.
Kynar, A Water-Based Fluoropolymer Platform, 2011, 4 pgs.
Milker, "New Generation of Multifunctional Crosslinkers", Pressure Sensitive Tape Council, pp. 53-80.
Nalco, General Product Information, Nalco Chemical Company, 1999, 1 pg.
Parker, "Water-Based FEVE Resin Technology for Performance Improvement in Architectural Coatings", AGC Chemicals, 2012, 39 pgs.
XAMA 7, Polyfunctional Aziridine, 2004, 2pgs, XP055160058.
International Search Report for PCT International Application No. PCT/CN2013/086680, dated Aug. 8, 2014, 4pgs.

* cited by examiner

FLUOROPOLYMER COATINGS COMPRISING AZIRIDINE COMPOUNDS

CROSS REFERENCE TO RELATED APPLICATIONS

This application is a national stage filing under 35 U.S.C. 371 of PCT/CN2013/086680, filed Nov. 7, 2013, the disclosure of which is incorporated by reference in its/their entirety herein.

SUMMARY

In one embodiment, a fluoropolymer coating composition is described comprising an aqueous liquid medium, fluoropolymer particles dispersed in the aqueous liquid medium, and at least one aziridine compound. The aziridine compound comprises at least two aziridine groups (i.e. polyaziridine) or at least one aziridine group and at least one alkoxy silane group.

In another embodiment, an article is described comprising a substrate wherein a surface of the substrate comprises a coating comprising fluoropolymer particles; and a reaction product of at least one aziridine compound comprising at least two aziridine groups or at least one aziridine group and at least one alkoxy silane group. The coating can be utilized as a primer for bonding a non-fluorinated substrate to a fluoropolymer film and/or the coating can be used as an (e.g. outer exposed) surface layer. In some embodiments, the article may be the (e.g. backside) film of a photovoltaic module.

DETAILED DESCRIPTION

The following definitions apply throughout the specification and claims.

The term "aqueous" means that the liquid of the coating contains at least 50, 60, 70, or 80 percent by weight of water. It may contain a higher amount of water such as, for example, at least 85, 90, 95, or even at least 99 percent by weight of water or more. The aqueous liquid medium may comprise a mixture of water and one or more water-soluble organic cosolvent(s), in amounts such that the aqueous liquid medium forms a single phase. Examples of water-soluble organic cosolvents include methanol, ethanol, isopropanol, 2-methoxyethanol, 3-methoxypropanol, 1-methoxy-2-propanol, tetrahydrofuran, and ketone or ester solvents. The amount of organic cosolvent typically does not exceed 50, 40, 30, 20, or 15 wt.-% of the total liquids of the coating composition. The aqueous fluoropolymer coating composition described herein typically comprises at least 15 wt.-% and typically no greater than about 80 wt.-% aqueous liquid medium. In some embodiments, the aqueous fluoropolymer coating comprises no greater than 70 wt.-%, 60 wt.-%, 50 wt.-%, or 40 wt.-% aqueous liquid medium.

The term "nanoparticles" refers to particles with an average particle size of less than or equal to about 100 nanometers (nm).

A "dried" coating is a coating that has been applied from a coating composition that includes a liquid carrier (i.e. water and optionally cosolvent), and the liquid carrier has been substantially completely removed, for example by evaporation. A dried coating may also be cured (i.e., cross-linked) as a result of reaction between the reactive functional groups of the fluoropolymer and the aziridine compound, for example during evaporation. The rate and degree of curing can typically be enhanced by heating the coating composition during or after the drying process.

The term "liquid" means liquid at a temperature of 25° C. and a pressure of 1 atm.

The aqueous coating composition described herein comprises at least one fluoropolymer.

Fluoropolymers comprises multiple carbon-fluorine bonds and are generally prepared from at least one fluorinated monomer. Examples of fluorinated monomers that may be polymerized include fluorinated olefins such as tetrafluoroethylene (TFE), chlorotrifluoroethylene (CTFE), hexafluoropropylene (HFP), 1-fluoro ethylene, otherwise known as vinyl fluoride (VF); 1,1-difluoro ethylene, otherwise known as vinylidene fluoride (VDF, VF2); partially or fully fluorinated allyl ethers; and partially or fully fluorinated vinyl ethers. The polymerization may further comprise non-fluorinated monomers such as ethylene, propylene, and non-fluorinated vinyl ethers.

Fluorinated vinyl ethers monomers include those corresponding to the formula:

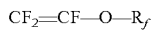

$$CF_2=CF-O-R_f$$

wherein $R_f$ represents a perfluorinated aliphatic group that may contain one or more oxygen atoms. In some embodiments, the perfluorovinyl ethers correspond to the general formula:

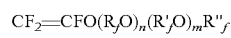

$$CF_2=CFO(R_fO)_n(R'_fO)_mR''_f$$

wherein $R_f$ and $R'_f$ are different linear or branched perfluoroalkylene groups of 2-6 carbon atoms, m and n are independently 0-10, and $R''_f$ is a perfluoroalkyl group of 1-6 carbon atoms. Examples of perfluorovinyl ethers according to the above formulas include perfluoro-2-propoxypropylvinyl ether (PPVE-2), perfluoro-3-methoxy-n-propylvinyl ether, perfluoro-2-methoxy-ethylvinyl ether, perfluoromethylvinyl ether (PMVE), perfluoro-n-propylvinyl ether (PPVE-1) and $CF_3-(CF_2)_2-O-CF(CF_3)-CF_2-O-CF(CF_3)-CF_2-O-CF=CF_2$.

Examples of fluorinated allyl ethers that can be used include those corresponding to the general formula:

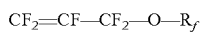

$$CF_2=CF-CF_2-O-R_f$$

wherein $R_f$ represents a perfluorinated aliphatic group that may contain one or more oxygen atoms.

The fluorine content of the fluoropolymer is typically at least 60, 65, 66, 67, 68, 69, or 70 wt-% of the fluoropolymer and typically no greater than 77 wt-%. In some embodiments, the coating composition comprises one or more fluoropolymers in the absence of non-fluorinated polymeric binders. In such embodiments, the non-solvent organic portion of the coating composition (i.e. of the total non-aqueous composition except for the inorganic nanoparticles) also has a fluorine content in the range just described. However, the fluorine content of the organic portion is slightly lower than that of the fluoropolymer(s) due to the inclusion of the aziridine compound.

The aqueous fluoropolymer coating composition preferably comprises a waterborne fluoropolymer, e.g. a fluoropolymer derived from an aqueous emulsion polymerization of at least one fluorinated monomer and an initiator as described for example in U.S. 2011/0034604; incorporated herein by reference. Waterborne fluoropolymers typically comprise small concentrations of polar functional groups including hydroxyl and carboxylate groups. For example, the uses of sulfinates, such as ammonium perfluorobutyl sulfinate, as part of the initiator system can produce such polar groups. In some embodiments, the fluoropolymer comprises at least about 0.01, 0.02, 0.03, 0.04, or 0.05 up to 0.1 mole % of polar functional groups including hydroxyl and/or carboxylate groups. Such hydroxyl and/or carboxylate groups are surmised to crosslink with aziridine groups of the polyaziridine compound.

The coating composition comprises an aqueous fluoropolymer latex dispersion of one type of fluoropolymer or a blend of the various fluoropolymers as described herein.

In some embodiments, the fluoropolymer is a homopolymer of a fluorinated monomer such as polytetrafluoroethylene. In other embodiments, the fluoropolymers is a copolymer of two or more fluorinated monomers. In yet other embodiments, the fluoropolymer is a copolymer of one or more fluorinated monomers and at least one non-fluorinated monomer. For example, the fluoropolymer may be a copolymer of TFE and ethylene; or a copolymer of TFE, hexafluoropropylene (HFP), and ethylene.

In some embodiments, the coating composition comprises or consists of fluoropolymer(s) having monomeric (e.g. repeat) units derived from TFE and/or CTFE and monomeric units derived from non-fluorinated or fluorinated vinyl ethers. In some embodiments, the molar amount of TFE and/or CTFE is at least 55, 60, 65, or 70 mole % of the fluoropolymer. Fluoropolymers of this type may be substantially free of monomeric units derived from vinyl fluoride (VF) and/or vinylidene fluoride (VDF, VF2).

In some embodiments, the fluoropolymer of the coating composition comprises at least 5, 10, 15, 20, 25, 30, or 35 mole % of monomeric units derived from a non-fluorinated vinyl ether monomer. A commercially available fluoropolymer of this type is a water-based fluoroethylene vinyl ether copolymer available from Zhenbang Co. (Dalian, China) under the trade designation "Lumiflon ZBF500-1".

In some embodiments, fluoropolymers useful in the present invention comprise monomeric (e.g. repeat) units derived from vinyl fluoride (VF) and/or vinylidene fluoride (VDF, VF2). In some embodiments, the fluoropolymer is a homopolymer derived from VF and/or vinylidene fluoride. In other embodiments, the fluoropolymer is a copolymer of VF and/or VDF and at least one other comonomer.

The molar amount of vinylidene fluoride of the copolymer is typically at least 30 or 35 and typically no greater than 60 mole %. In some embodiments, the molar amount of vinylidene fluoride is no greater than 50 mole %. In some embodiments, the fluoropolymer is a copolymer formed from the monomers tetrafluoroethylene (TFE), hexafluoropropylene (HFP), and vinylidene fluoride (VDF, VF2). Such monomer structures are shown as follows:

TFE: $CF_2=CF_2$
VDF: $CH_2=CF_2$
HFP: $CF_2=CF-CF_3$

The fluoropolymer may comprise or consist of monomeric (e.g. repeat) units derived from these three particular monomers in varying molar amounts. Such fluoropolymer may have the general formula:

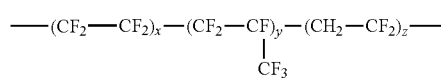

wherein x, y and z are expressed as molar percentages.

For some embodied thermoplastic fluoropolymers, x (i.e. TFE) is greater than zero and typically at least 20, 25, or 30 molar percent of the fluoropolymer. In some embodiments, x is no greater than 60 or 55. In other embodiments, x is not greater than 50 mole %. The molar amount of y (i.e. HFP) is typically at least 5, 6, 7, 8, 9, or 10 and less than about 15 molar percent. In some embodiments, the molar amount of z (i.e. VDF) is at least 30 or 35 and typically no greater than 60. In some embodiments, y is no greater than 50.

In some embodiments, the coating composition comprises fluoropolymer(s) having monomer (e.g. repeat) units derived from tetrafluoroethylene ("TFE"), hexafluoropropylene (HFP), and vinylidene fluoride (VDF, VF2). Examples of such commercially available fluoropolymers are available from 3M under the trade name Dyneon™ Fluoroplastic THV™ 200; Dyneon™ Fluoroplastic THV™ 300; Dyneon™ Fluoroplastic THV™ 400; Dyneon™ Fluoroplastic THV™ 500; and Dyneon™ Fluoroplastic THV™ 800 described in U.S. Pat. No. 7,323,514.

In other embodiments, the fluoropolymer is formed from the monomers vinyl fluoride (VF) and/or vinylidene fluoride ("VDF," "VF2,") such that the amount is greater than 55, 60, 65, or 70 mole % of the fluoropolymer. Representative fluoropolymer of this type are commercially available from Arkema Inc. Philadelphia, Pa. under the trade designation.

In some embodiments, the fluoropolymers lack reactive functionality (i.e. other than carboxylate or hydroxyl functionality) derived from inclusion of a cure-site monomer. In other embodiments, the fluoropolymers comprise reactive functionality derived from inclusion of a cure-site monomer.

The aqueous emulsion polymerization of the fluoropolymer may involve comonomers that have a functional group such as for example a group capable of participating in a peroxide cure reaction. Such functional groups include halogens such as Br or I.

Specific examples of such comonomers that may be listed here include (a) bromo- or iodo-(per)fluoroalkyl-(per)fluorovinylethers having the formula:

$$Z-R_f-O-CX=CX_2$$

wherein each X may be the same or different and represents H or F, Z is Br or I, $R_f$ is a (per)fluoroalkylene $C_1$-$C_{12}$, optionally containing chlorine and/or ether oxygen atoms; for example: $BrCF_2-O-CF=CF_2$, $BrCF_2CF_2-O-CF=CF_2$, $BrCF_2CF_2CF_2-O-CF=CF_2$, $CF_3CFBrCF_2-O-CF=CF_2$, and the like; and (b) bromo- or iodo containing fluoroolefins such as those having the formula:

$$Z'-(R_f')_r-CX=CX_2,$$

wherein each X independently represents H or F, Z' is Br or I, $R_f$ is a perfluoroalkylene $C_1$-$C_{12}$, optionally containing chlorine atoms and r is 0 or 1; for instance: bromotrifluoroethylene, 4-bromo-perfluorobutene-1, and the like; or bromofluoroolefins such as 1-bromo-2,2-difluoroethylene and 4-bromo-3,3,4,4-tetrafluorobutene-1.

The aqueous emulsion polymerization of the fluoropolymer may involve comonomers that have a functional group. Nitrile groups can be "cured" by catalyzing trimerization to triazines.

Examples of nitrile containing monomers that may be used include those that correspond to one of the following formulas:

$$CF_2=CF-CF_2-O-R_f-CN$$

$$CF_2=CFO(CF_2)_LCN$$

$$CF_2=CFO[CF_2CF(CF_3)O]_g(CF_2)_vOCF(CF_3)CN$$

$$CF_2=CF[OCF_2CF(CF_3)]_kO(CF_2)_uCN$$

wherein L represents an integer of 2 to 12; g represents an integer of 0 to 4; k represents 1 or 2; v represents an integer of 0 to 6; u represents an integer of 1 to 6, $R_f$ is a perfluoroalkylene or a bivalent perfluoroether group. Specific examples of nitrile containing liquid fluorinated monomers include perfluoro(8-cyano-5-methyl-3,6-dioxa-1-octene), $CF_2=CFO(CF_2)_5CN$, and $CF_2=CFO(CF_2)_3OCF(CF_3)CN$.

In some embodiments, the fluoropolymer may involve comonomers that have a (e.g. halogen) functional group capable of being crosslinked by a multi-(meth)acrylate compound, such as described in U.S. Pat. No. 7,323,514. The multi-(meth)acrylate crosslinker typically comprises at least two (meth)acrylate groups. Representative compound include the same multi-(meth)acrylate compound that can be used for the preparation of the polyaziridine compound by Michael addition as will subsequently be described.

The aqueous emulsion polymerization may be used to produce a variety of fluoropolymers including perfluoropolymers, which have a fully fluorinated backbone, as well as partially fluorinated fluoropolymers. The aqueous emulsion polymerization may result in melt-processible fluoropolymers as well as those that are not easily melt-processible such as for example polytetrafluoroethylene and so-called modified polytetrafluoroethylene. The polymerization process can further yield fluoropolymers that can be cured to make fluoroelastomers as well as fluorothermoplasts. Fluorothermoplasts are generally fluoropolymers that have a distinct and well noticeable melting point, typically in the range of 60 to 320° C. or between 100 and 320° C. Thus, they have a substantial crystalline phase. Fluoropolymers that are used for making fluoroelastomers typically are amorphous and/or have a negligiable amount of crystallinity such that no or hardly any melting point is discernible for these fluoropolymers. The glass transition temperature (Tg) of commercially available fluoropolymer elastomers typically ranges from room temperature to about −40° C.

In some embodiments, the thermoplastic fluoropolymers have a melt temperature ranging from about 200° C. to about 280° C., 290° C., 300° C., or 325° C. In this embodiment, the melt temperature can be at least 210° C., 215° C., 220° C., or 225° C. In other embodiments, the melt temperature ranges from about 110° C. to about 180° C. In this embodiment, the melt temperature can be at least than 125° C., 130° C., 135° C. or 140° C. The melt temperature of the fluoropolymer is related to the temperature at which the dried coating can be heat laminated to another thermoplastic material, such as an (e.g. EVA) encapsulant and/or (e.g. PET) polymeric substrate film (e.g. of a photovoltaic cell). In some embodiments, a fluoropolymer having a melt temperature less than 130° C., or 125° C., or 120° C. is blended with a fluoropolymer having a melt temperature greater than 130° C., 140° C., 150° C., 160° C. In other embodiments, a fluoropolymer having a melt temperature less than 130° C., or 125° C., or 120° C. is blended with a fluoropolymer having a melt temperature greater than 200° C., 250° C., 275° C., or 300° C. Such blends can provide a relatively low heat lamination temperature in combination with good mechanical properties and durability.

The fluoropolymer dispersed in the aqueous diluent is a film-forming polymer. Suitable polymer latexes and methods for making them are widely known in the art, and many are commercially available. Typically, although not necessary, the particles in the fluoropolymer latexes are substantially spherical in shape. The polymer core may comprise one or more water-insoluble polymers, although this is not a requirement. Useful polymer particle sizes include those typical of latexes and other dispersions or emulsions. Typical polymer particle sizes are in a range of from about 0.01 micrometers (10 nm) to 100 micrometers. In some embodiments, the average particle size is at least 20, 30, 40, 50, or 60 nm. In some embodiments, the average particle size of the fluoropolymer is no greater than 300, 250, 200, 100 or 75 nanometers. Particles in the range from about 1 nm to 100 nm are often termed "nanoparticles" while those from about 200 nm (0.2 micrometers) up to about 2 micrometers are often termed "microparticles". However, many polymer latexes are of sizes intermediate between these ranges, e.g. from about 50 nm to about 500 nm.

In some embodiments, the coating composition (e.g. useful as a primer) is free of inorganic nanoparticles or comprises a relatively small concentration of inorganic nanoparticles (e.g. as a thickener). In this embodiment, the total concentration of fluoropolymers can be at least 90, 91, 92, 93, 94, 95, 96, 97, 98, or 99 wt-% solids of the total weight of the dried coating composition. In other embodiments, the coating composition (e.g. useful for a backside coating of a photovoltaic module or a surface coating of an optical display device) comprises one or more fluoropolymers, one or more aziridine compounds (reaction products thereof), and a higher concentration of inorganic nanoparticles. In such embodiments, the coating composition may comprise less than 90 wt-% solid of fluoropolymer(s). As the concentration of nanoparticles increases, the concentration of fluoropolymer decreases. The fluoropolymer coating composition typically comprises one or more fluoropolymers in an amount of at least 15, 16, 17, 18, 19, or 20 wt-% solids of the dried coating composition. In some embodiments, the amount of fluoropolymer is at least 20, 25, or 30 wt-% and in some embodiments at least 35 or 40 wt-% of the dried coating composition. In some embodiments, the amount of fluoropolymer is no greater than 80, 70, or 60 wt-% of the dried coating composition.

In some embodiments, the fluoropolymer coating composition comprises one or more aziridine compounds typically present in a total amount of at least 0.1, 0.2, 0.3, 0.4, or 0.5 wt-% up to 1, 2 or 3 wt-% solids of the coating composition. The dried fluoropolymer coating comprises a reaction product of such aziridine compound(s). Such reaction product generally comprises a ring-opened aziridine linkage, otherwise known as an amide linkage, characterized by the presence of a —NH. At such low concentrations, any crosslinking that does occur between functional groups of the fluoropolymer and the aziridine compound typically does not result in an appreciable improvement in mechanical properties. However, such low concentrations can provide a substantial improvement in adhesion, especially to polymeric substrates, such as PET. In other embodiments, a higher concentration of aziridine compound is utilized. For example, the concentration of aziridine compound or reaction product thereof can range up to 5, 10, 15, 20, 25 or 30 wt-% of the solids of the coating composition. Higher concentrations are typically utilized for embodiments wherein higher concentrations of inorganic nanoparticles are utilized and an aziridine compound is utilized that can react with the inorganic nanoparticles. For example, the alkoxy silane groups of an aziridine alkoxy silane compound can react with hydroxyl groups present on the inorganic nanoparticles; while the aziridine group can improve adhesion with the substrate. In some embodiments, a combination of at least one aziridine compound that comprises at least two aziridine groups and at least one aziridine alkoxy silane compound is utilized at a weight ration of 1:4 to 4:1 or 1:3 to 3:1 or 1:2 to 2:1 or about 1:1.

In some embodiments, the aziridine compound comprises at least two aziridine groups. The aziridine compound may comprise 3, 4, 5, 6, or greater than 6 aziridine groups. The aziridine compound may be represented by the following structure:

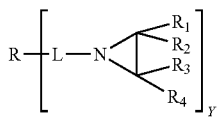

wherein R is a core moiety having a valency of Y;
L is a bond, divalent atom, or divalent linking group;
$R_1$, $R_2$, $R_3$, and $R_4$ are independently hydrogen or a $C_1$-$C_4$ alkyl (e.g. methyl); and
Y is typically 2, 3, or greater.

In some embodiments, R is $-SO_2-$. In some embodiments, R-L is a residue of a multi(meth)acrylate compound.

known as 2-methyl ethylenimine). Suitable multi(meth)acrylate compounds comprise at least two and is some embodiments at least 3, 4, 5, or 6 (meth)acrylate functional groups. Representative multi(meth)acrylate compounds typically comprise at least two (meth)acrylate groups including for example hexanediol acrylate (HDDA), pentaerythritol tri(meth)acrylate, pentaerythritol tetra(meth)acrylate, trimethylolpropane tri(methacrylate), dipentaerythritol penta(meth)acrylate, dipentaerythritol hexa(meth)acrylate, trimethylolpropane ethoxylate tri(meth)acrylate, glyceryl tri(meth)acrylate, pentaerythritol propoxylate tri(meth)acrylate, and di(trimethylolpropane) tetra(meth)acrylate. In such reaction, each (meth)acrylate group provides a site for addition of the aziridine group and. Thus, R-L is a residue (i.e. recognizable part) of the multi(meth)acrylate compound. Some representative polyaziridine compounds that can be prepared via a Michael addition are as follows:

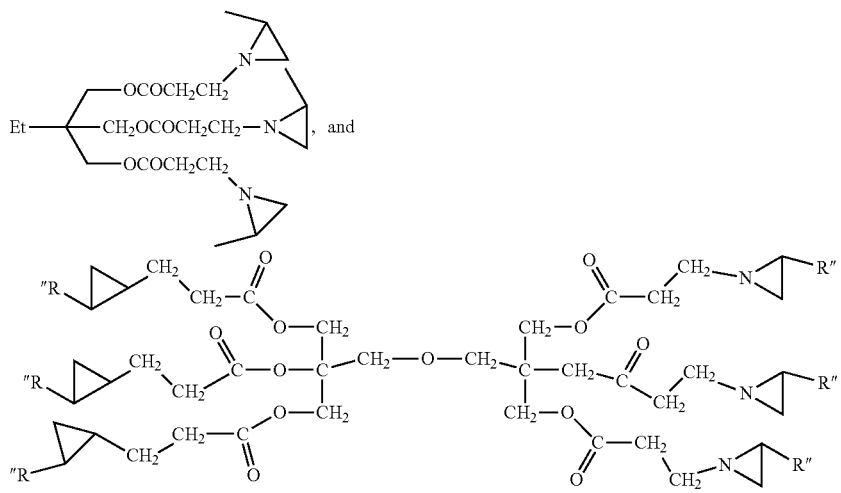

In some embodiments L is a $C_1$-$C_4$ alkylene, optionally substituted with one or more (e.g. contiguous or pendant) oxygen atoms thereby forming ether or ester linkages. In typical embodiments, $R_1$ is methyl and $R_2$, $R_3$, and $R_4$ are hydrogen.

Representative aziridine compounds include trimethylolpropane tri-[beta-(N-aziridinyl)-propionate, 2,2-bishydroxymethyl butanoltris[3-(1-aziridine) propionate]; 1-(aziridin-2-yl)-2-oxabut-3-ene; and 4-(aziridin-2-yl)-but-1-ene; and 5-(aziridin-2-yl)-pent-1-ene.

In some embodiments, a polyaziridine compound can be prepared by reacting divinyl sulfone with alkylene (e.g. ethylene) imine, such as described in U.S. Pat. No. 3,235,544. On representative compound is di(2-propyleniminoethyl)sulfone, as depicted as follows:

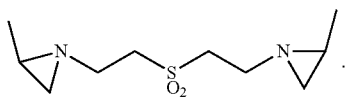

Polyaziridine compounds can be prepared via a Michael addition of a multi(meth)acrylate compound with a (e.g. $C_1$-$C_4$ alkyl) aziridine, such as 2-methyl aziridine (also In some embodiments, the polyaziridine compound lacks hydrolyzable (e.g. linking) groups, such as linking groups comprising an ester group. One representative compound is as follows:

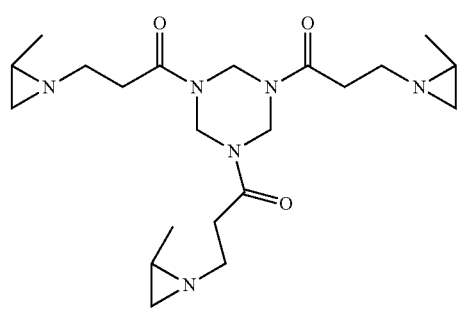 [SMILES: CC1CN1CCC(=O)N1CN(C(=O)CCN2CC2C)CN(C(=O)CCN2CC2C)C1]

The synthesis of this compound is described in Ser. No. 62/901,016, titled "FLUROPOLYMER COATINGS COMPRISING AZIRIDINE COMPOUND AND NON-FLUORINATED POLYMER" cofiled Nov. 7, 2013.

In some embodiments the polyaziridine compound may comprise alkylene oxide repeat units, such as ethylene oxide repeat units. The number of alkylene oxide (e.g. ethylene oxide) repeats units is typically at least 2 or 3 and typically no greater than about 20. In some embodiments, the number of alkylene oxide (e.g. ethylene oxide) repeat units averages about 6, 7, 8, or 9. One representative of this type is as follows.

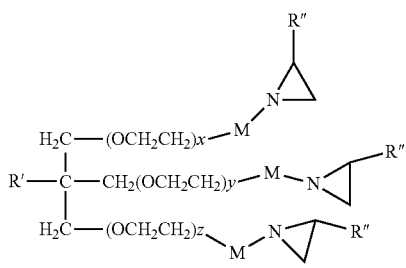

wherein R' is independently hydrogen or a $C_1$-$C_4$ alkyl;
R" is hydrogen or a $C_1$-$C_4$ alkyl (e.g. methyl);
x, y, and z are independently at least 1; and
M is a bond, divalent atom, or divalent linking group.

In some embodiments, the sum of x+y+z is at least 3, 4, 5, or 6. Further the sum of x+y+z is typically no greater than 20. In some embodiments, M is a covalent bond or a $C_1$-$C_4$ alkylene.

Other polyaziridine compounds comprising alkylene oxide repeat units are described in U.S. Pat. No. 8,017,666; incorporated herein by reference.

The above described polyaziridine compounds comprise at least two aziridine groups at the time the compound is added to the coating composition. In other embodiments, the polyaziridine compound does not comprise two aziridine groups at the time the compound is added to the coating composition, yet forms a polyaziridine in-situ. For example, compounds comprising a single aziridine group and a single (meth)acrylate group can form a dimer or oligomerize by reaction of the (meth)acrylate groups thereby forming a polyazirdine (i.e. diaziridine) compound.

In other embodiments, the aziridine compound is an aziridine alkoxy silane compound, also referred to as aziridinyl siloxanes. Such compounds are known for examples from U.S. Pat. No. 3,243,429; incorporated herein by reference. Aziridine alkoxy silane compounds may have the general structure:

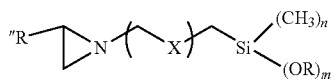

wherein R" is hydrogen or a $C_1$-$C_4$ alkyl (e.g. methyl);
X is a bond, a divalent atom, or a divalent linking group;
n is 0, 1 or 2;
m is 1, 2, or 3; and
and the sum or n+m is 3.

One representative compound is 3-(2-methylaziridinyl) ethylcarboxylpropyltriethoxysilane.

In some embodiments, the coating composition is free of inorganic nanoparticles. In other embodiments, the coating composition comprises inorganic nanoparticles.

The inorganic oxide particles are nanoparticles, typically having an average primary or agglomerate particle size diameter of at least 1, 2, 3, 4, or 5 nanometers and typically no greater than 80, 90, 100, or 200 nanometers. The average particle size of the nanoparticles of the cured coating can be measured using transmission electron microscopy. The average particle size of the nanoparticles of the coating solution can be measured using dynamic light scattering. "Agglomerate" refers to a weak association between primary particles which may be held together by charge or polarity and can be physically broken down into smaller entities. "Primary particle size" refers to the mean diameter of a single (non-aggregate, non-agglomerate) particle. Unlike fumed silica that comprises silica aggregates, in favored embodiments the nanoparticles utilized herein comprise a substantial concentration of discrete unaggregated nanoparticles. As used herein "aggregate" with respect to particles refers to strongly bonded or fused particles where the resulting external surface area may be significantly smaller than the sum of calculated surface areas of the individual components. The forces holding an aggregate together are strong forces, for example covalent bonds, or those resulting from sintering or complex physical entanglement. Although agglomerated nanoparticles can be broken down into smaller entities such as discrete primary particles such as by application of a surface treatment; the application of a surface treatment to an aggregate simply results in a surface treated aggregate. In some embodiments, a majority of the nanoparticles (i.e. at least 50%) are present as discrete unagglomerated nanoparticles. For example, at least 70%, 80% or 90% of the nanoparticles are present as discrete unagglomerated nanoparticles.

Preferably, the nanoparticles comprise silica. Nanoparticles can include essentially only silica (although other oxides can be used, such as $ZrO_2$, colloidal zirconia, $Al_2O_3$, colloidal alumina, $CeO_2$, colloidal ceria, $SnO_2$, colloidal tin (stannic) oxide, $TiO_2$, colloidal titanium dioxide), or they can be composite nanoparticles such as core-shell nanoparticles. A core-shell nanoparticle can include a core of an oxide (e.g., iron oxide) or metal (e.g., gold or silver) of one type and a shell of silica deposited on the core. Herein, "silica nanoparticles" refer to nanoparticles that include only silica as well as core-shell nanoparticles with a surface that includes silica.

The coatability of the aqueous coating composition can be improved by inclusion of a small concentration of inorganic nanoparticles such as silica or clay that functions, at least in part, as a thickener. In this embodiment, the coating composition may contain 1, 2, 3, 4, or 5 wt-% of inorganic oxide nanoparticles. In order to improve mechanical properties, such as abrasion resistance and pencil hardness, the concentration of (e.g. silica) inorganic nanoparticles is typically at least 5, 6, 7, 8, 9, or 10 wt-% solids of the dried coating composition. In some embodiments, the dried coating compositions comprises at least 11, 12, 13, 14 or 15 wt-% of (e.g. silica) inorganic nanoparticles. In some embodiments, the dried coating compositions comprises no greater than 60, 55, 50, 45 or 40 wt-% of (e.g. silica) inorganic nanoparticles.

The nanoparticles are typically relatively uniform in size. The variability in the size of the nanoparticles is typically less than 25 percent of the mean particle size. In some embodiments the (e.g. silica) nanoparticles have a relatively small average particle size. For example, the average primary or agglomerate particle size may be less than 75 nm, 50 nm, or 25 nm and in some embodiments, less than 20 nm, 15 or 10 nm. When such smaller nanoparticles are employed, it is typically preferred that such nanoparticles are surface modified with a hydrophilic surface treatment such as 3-glycidoxylpropyl trimethoxy silane.

Alternatively, the nanoparticles can be surface modified with other hydrophilic organosilane surface treatment (e.g. lacking a longer chain alkyl group having 4 or more carbon atoms) that typically comprise other hydrophilic groups such as alkylene oxide groups, acids and salts, as well as hydroxyl groups. Suitable hydrophilic surface treatments include poly (ethyleneoxide)/poly(propyleneoxide) trialkoxysilane, sulfonato-organosilanols, also called organosilanol-sulfonic acids/salts having chemical structures such as described in U.S. Pat. No. 4,338,377 and U.S. Pat. No. 4,152,165. Representative surface treatments include $NaOSi(OH)_2(CH_2)_3SO_3Na$, $(OH)_3Si(CH_2)_3OCH_2CH(OH)CH_2SO_3H$, 3-hydroxyl propyl trimethoxysilane, $(HO)_3SiCH_2CH_2COOH$ and its carboxylate silane. Since the coating compositions are not subjected to photocrosslinking, the (e.g. silica) nanoparticles typically do not comprise a surface treatment having a vinyl or (meth)acrylate moiety.

In the absence of surface modification of such relatively small nanoparticles, the coating can exhibit short solution shelf-life time. However, when the (e.g. silica) inorganic oxide nanoparticles have an average particle size of greater than 20 nm, the nanoparticles do not require surface modification to provide useful solution stability. Thus the nanoparticles are "unmodified nanoparticles" since the nanoparticles do not comprise a surface treatment. It is appreciated however, that unmodified silica nanoparticles commonly comprise hydroxyl or silanol functional groups on the nanoparticle surface, particularly when the nanoparticles are provided in the form of an aqueous dispersion. Further, the larger nanoparticles can optionally be surface modified with the hydrophilic surface treatments previously described.

Inorganic silica sols in aqueous media are well known in the art and available commercially. Silica sols in water or water-alcohol solutions are available commercially under such trade names as LUDOX (manufactured by E. I. duPont de Nemours and Co., Inc., Wilmington, Del.), NYACOL (available from Nyacol Co., Ashland, Mass.) or NALCO (manufactured by Nalco Chemical Co., Oak Brook, Ill.). Some useful silica sols are NALCO 1115, 2326, 1050, 2327, and 2329 available as silica sols with mean particle sizes of 4 nanometers (nm) to 77 nm. Another useful silica sol is NALCO 1034a available as a silica sol with mean particle size of 20 nanometers. Another useful silica sol is NALCO 2326 available as a silica sol with mean particle size of 5 nanometers. Additional examples of suitable colloidal silicas are described in U.S. Pat. No. 5,126,394. Siliceous nanoparticles (that include silica nanoparticles) are also available from Southern Clay Product Inc., Gonzales, Tex.

In some embodiments, the silica nanoparticles used in coating compositions are acicular. The term "acicular" refers to the general elongated shape of the particles and may include other string-like, rod-like, chain-like shapes, as well as filamentary shapes. The acicular colloidal silica particles may have a uniform thickness of 5 to 25 nm, a length, Di, of 40 to 500 nm (as measured by dynamic light-scattering method) and a degree of elongation D1/D2 of 5 to 30, wherein $D_2$ means a diameter in nm calculated by the equation $D_2=2720/S$ and S means specific surface area in $m^2/g$ of the particle, as is disclosed in the specification of U.S. Pat. No. 5,221,497.

U.S. Pat. No. 5,221,497 discloses a method for producing acicular silica nanoparticles by adding water-soluble calcium salt, magnesium salt or mixtures thereof to an aqueous colloidal solution of active silicic acid or acidic silica sol having a mean particle diameter of 3 to 30 nm in an amount of 0.15 to 1.00 weight percent based on CaO, MgO or both to silica, then adding an alkali metal hydroxide so that the molar ratio of $SiO_2/M_2O$ (M:alkali metal atom) becomes 20 to 300, and heating the obtained liquid at 60 to 300 degrees centigrade for 0.5 to 40 hours. The colloidal silica particles obtained by this method are elongate-shaped silica particles that have elongations of a uniform thickness within the range of 5 to 40 nm extending in only one plane. Acicular silica sol may also be prepared as described in U.S. Pat. No. 5,597,512.

Useful acicular silica particles may be obtained as an aqueous suspension under the trade name SNOWTEX-UP by Nissan Chemical Industries (Tokyo, Japan). The mixture consists of 20-21 percent (w/w) of acicular silica, less than 0.35 percent (w/w) of $Na_2O$, and water. The particles are 9 to 15 nanometers in diameter and have lengths of 40 to 300 nanometers. The suspension has a viscosity of less than 100 mPas at 25 Degrees centigrade a pH of 9 to 10.5, and a specific gravity of 1.13 at 20 degrees centigrade.

The silica sols used in the present disclosure generally can include counter cations, in order to balance the surface charge of the colloids. Examples of cations suitable for use as counter ions for negatively charged colloids include $Na^+$, $K^+$, $Li^+$, a quaternary ammonium cation such as $NR_4^+$, wherein each R can be any monovalent moiety, but is preferably H or lower alkyl, such as $—CH_3$, combinations of these, and the like.

The method of making the coating entails providing an aqueous fluoropolymer latex dispersion (comprising fluoropolymer particles). When the dispersion is neutral or acidic, the method further comprises adjusting the pH of the mixture to be sufficiently basic, such as by addition of ammonia. The aqueous liquid medium preferably is basic, having a pH of at least 8 and typically no greater than 10, 10.5, 11, 11.5 or 12. The method further comprises adding at least one aziridine compound to the basic aqueous liquid medium. When the coating further comprises inorganic oxide nanoparticles, the inorganic oxide nanoparticles are typically also provided as an aqueous dispersion and may be added prior to adjusting the pH and prior to adding the aziridine compound.

Although the coating composition comprises water as the primary liquid component, in some embodiments, the coating composition may optionally comprise a small amount of an organic cosolvent. For example, organic cosolvents may be present in the commercially available aqueous dispersions of the fluoropolymer latex and/or inorganic oxide nanoparticles. The concentration of the organic cosolvent is typically no greater than 15 wt-% of the total liquids of the coating composition. In some embodiments, the organic cosolvent is no greater than 10 or 5 wt-% of the total liquids of the coating composition.

The coating composition may optionally comprise various additives as known in the art including for example thickeners (such as clay available from Southern Clay Product Inc., Gonzales, Tex., under the trade designation "LAPRD"), surfactants, pigments including $TiO_2$ or carbon black, fillers, as well as one or more light stabilizers. Light stabilizer additives include ultraviolet absorbing compounds such as hydroxybenzophenones and hydroxybenzotriazoles. Other light stabilizer additives include hindered amine light stabilizers (HALS) and antioxidants. Thermal stabilizers can also be used if desired.

When the coating lacks an inorganic nanoparticle thickener, the coating typically comprises a surfactant. Various surfactant suitable for fluoropolymer coatings are known, such as described in previously cited US2011/0034604. In one embodiment, the coating comprises an ionic surfactant such as a sodium alpha olefin sulfonates, commercially available from Stepan Company under the trade designation "A-18".

The coating composition may optionally comprise a non-fluorinated polymer (e.g. polymer binder), such as a polyurethane or acrylic polymer, in an amount up to about 5 or 10 wt-%. When present, the polymeric binder is typically present as discrete particles. Since the fluoropolymer and polymeric binder are not soluble in or swelled by the aqueous liquid medium, both the fluoropolymer and non-fluorinated polymer are generally present in particle form as can be determined by transmission electron microscopy. Hence, the fluoropolymer and non-fluorinated polymer typically do not form a continuous phase interpenetrating network. The fluoropolymer and non-fluorinated polymer can form a chemical network by reaction of the aziridine groups of a polyaziridine with the carboxylic groups of the fluoropolymer latex and non-fluorinated polymer latex. However, good adhesion, especially to polymeric substrates, such as PET, can be obtained in the absence of polymeric binder due to the improvement in adhesion provided by the aziridine compound. Hence, in typical embodiments, the coating composition is free of non-fluorinated polymer. A non-fluorinated polymer can typically be distinguished from non-fluorinated monomeric units of the fluoropolymer by chain length and linkage type. In some embodiments, the coating composition is typically substantially free of olefin units having a chain length greater than 20 carbon atoms. Further, non-fluorinated polymers typically have other linking groups that are not present in fluoropolymers. For example, a polyurethane polymer comprises urethane linkages; whereas an acrylic polymer comprise a carbonyl adjacent an ether linkage (e.g. acrylic acid alkyl ester linkages). Thus, when the coating composition is free of non-fluorinated polymer, the coating is typically free of polymers having heteroatoms such as oxygen and nitrogen that are characteristic of such polymers.

In one embodiment, the fluoropolymer coating composition includes barrier particles, such as described in U.S. Pat. No. 8,025,928. Such particles are platelet-shaped particles. Such particles tend to align during application of the coating and, since water, solvent and gases such as oxygen cannot pass readily through the particles themselves, a mechanical barrier is formed in the resulting coating which reduces permeation of water, solvent and gases. In a photovoltaic module, for example, the barrier particles substantially increase the moisture barrier properties of the fluoropolymer and enhance the protection provided to the solar cells. Barrier particles can be in amount from about 0.5 to about 10% by weight based on the total dry weight of the fluoropolymer composition in the coating.

Examples of typical platelet shaped filler particles include clay, mica, glass flake and stainless steel flake, and aluminum flake. In one embodiment, the platelet shaped particles are mica particles, including mica particles coated with an oxide layer such as iron or titanium oxide. In some embodiments, these particles have an average particle size of about 10 to 200 microns in more specific embodiments 20 to 100 microns with no more than 50% of the particles of flake having average particle size of more than about 300 microns.

The fluoropolymer coating described herein can be used to prepare a coated substrate wherein a surface of the substrate comprises the dried coating composition. In some embodiments, the substrate may be an inorganic substrate, such as glass, or polymeric substrate. In other embodiments, the substrate is a polymeric substrate. Polymeric substrates can be made of polyester (e.g., polyethylene terephthalate (PET), polybutylene terephthalate), polycarbonate (PC), allyldiglycolcarbonate, polyacrylates such as polymethylmethacrylate, polystyrene, polysulfone, polyethersulfone, cellulose acetate butyrate, polyolefin, PVC, polyamide, polyurethane, polyimide, polyurea, and the like, including blends and laminates thereof.

In some embodiments, the substrate is a planar substrate such as a panel or film substrate. The thickness of the substrate can vary, but typically ranges from about 2 mils to about 30 mils.

In some embodiments, the substrate is light transmissive, having light transmission between at least 300 nm to 1200 nm.

The surface of the (e.g. polymeric) substrate which is to be coated may be surface treated to improve adhesion such as by electrical discharge such as corona treatment or by atmospheric nitrogen plasma treatment. However, the coating composition described herein has been found to exhibit good adhesion to polymer (e.g. polyester) substrates and other fluoropolymer coatings and films in the absence of such surface treatment.

The aqueous fluoropolymer coating compositions for making the fluoropolymer coated film can be applied as a liquid directly to suitable (e.g. polymeric) substrate films by conventional coating means such as spray, roll, knife, curtain, gravure coaters, or any other method that permits the application of a relatively uniform coating. In some embodiments, the primer coating thickness of the dried coating is between about 2.5 microns (0.1 mil) and about 25 microns (1 mil). In some embodiments, the dried coating has a thickness no greater than 20 microns, or 15 microns, or 10 microns. In some embodiments, the coating thickness of an exposed outer surface layer (e.g. backside of photovoltaic module) is the same thickness of the primer. In other embodiments, the coating thickness ranges up to 250 microns (10 mils). A single coating or multiple coatings can be applied to obtain the desired thickness.

After application, the water (and optional cosolvent) is removed, and the fluoropolymer coating is adhered to the (e.g. polymeric) substrate (e.g. film). In some embodiments the coating compositions can be coated onto the substrate and allowed to air dry at ambient temperatures. Although not necessary to produce a coalesced film, heating is generally desirable for crosslinking and to dry the coating more quickly. The coated substrate can be subjected to a single heating step or by multiple heating steps. The drying temperature can range from room temperature to oven temperatures in excess of that required for the coalescence of fluoropolymers. Thus, the drying temperature can be in the range of about 25° C. to about 200° C. The drying temperature can increase as the concentration of TFE increases. In some embodiments, the drying temperature is least about 125° C., 130° C., 135° C., 140° C., 145° C., or 160° C. Typically, the drying temperature is selected based on the melting temperature of a selected fluoropolymer resin.

In some embodiments, fluoropolymer coated films are useful in photovoltaic modules that convert solar energy to electrical energy. A typical construction for a photovoltaic module 100 includes a thick layer of glass as a glazing material. The glass protects solar cells comprising crystalline silicon wafers and wires that are embedded in a moisture resisting plastic sealing (e.g. encapsulant) compound, and such as cross-linked ethylene vinyl acetate. Typically includes two wafers of doped silicon (p-type and n-type) in contact to form a junction with each wafer having an electrical connection. As an alternative to crystalline silicon wafers and wires, thin film solar cells can be applied from various semiconductor materials, such as CIGS (copper-indium-gallium-selenide), CTS (cadmium-tellurium-sulfide), a-Si (amorphous silicon) and others on a carrier sheet which is also jacketed on both sides with encapsulant materials. The encapsulant is bonded to a backsheet. Fluoropolymer coated films are useful for such backsheet. In one embodiment, the polymeric substrate film is a polyester, and in a more specific embodiment, a polyester selected from the group consisting of polyethylene terephthalate, polyethylene naphthalate and a coextrudate of polyethylene terephthalate/polyethylene naphthalate. In one embodiment the polymeric substrate is a heat sealable film such as 3M™ Scotchpak™ Heat Sealable Polyester Film that comprises PET combined with olefinic polymers such as ethylene vinyl acetate (EVA). Polyester provides electrical insulation and moisture barrier properties, and is an economical component of the backsheet. The dried fluoropolymer coating described herein forms the outer layer that is typically exposed to the environment. In another embodiment, (not shown) both surfaces of the polymeric substrate film are coated with fluoropolymer creating a sandwich of polyester between two layers of coating of fluoropolymer. In some embodiments, the fluoropolymer layer may be bonded directly to the (e.g. EVA) encapsulant. Fluoropolymer films provide excellent strength, weather resistance, UV resistance, and moisture barrier properties to the backsheet.

In one embodiment, the fluoropolymer film comprises primer layer, formed from a dried fluoropolymer coating composition as described herein, present between the polymeric substrate film and the dried fluoropolymer coating surface layer. In this embodiment, both the primer layer and the outer layer can be formed from an aqueous fluoropolymer coating as described herein. Alternatively, the outer layer can be formed from a thermoplastic fluoropolymer that is extruded molten onto the primer layer or heat laminated to the primer layer. In this embodiment, the fluoropolymer layer disposed on the primer lacks fluoropolymer particles. In both embodiments, the outer layer typically has a higher concentration of inorganic nanoparticles as compared to the primer layer.

A (e.g. polymeric) film having a coating, as described herein, is surmised to have other uses. In another embodiment, the article comprises a substrate, such as a polymeric film, comprising the dried aqueous fluoropolymer coating. Primer layer, formed from the dried fluoropolymer coating composition as described herein, may be present between the polymeric substrate film and a fluoropolymer film layer. In some embodiments, the fluoropolymer film layer comprises a dried fluoropolymer coating, as described herein.

Objects and advantages of this invention are further illustrated by the following examples, but the particular materials and amounts thereof recited in these examples, as well as other conditions and details, should not be construed to unduly limit this invention. These examples are merely for illustrative purposes only and are not meant to be limiting on the scope of the appended claims.

EXAMPLES

Materials

Unless otherwise noted, all parts, percentages, ratios, etc., in the examples and in the remainder of the specification are by weight. Unless otherwise noted, all chemicals were obtained or are available from, chemical suppliers such as Aldrich Chemical Company, Milwaukee, Wis.

"2 nm $SiO_2$" was silica nanoparticle dispersion, particle size 2 nm, obtained from Nalco Company, Naperville, Ill., under trade designation "NALCO 8699".

"5 nm $SiO_2$" was silica nanoparticle dispersion, particle size 5 nm, obtained from Nalco Company, Naperville, Ill., under trade designation "NALCO 2326".

"20 nm $SiO_2$" was silica nanoparticle dispersion, particle size 20 nm, obtained from Nalco Company, Naperville, Ill., under trade designation "NALCO 1050".

"75 nm $SiO_2$" was silica nanoparticle dispersion, particle size 75 nm, obtained from Nalco Company, Naperville, Ill., under trade designation "NALCO 2329".

"Clay" available from Southern Clay Product Inc., Gonzales, Tex., under the trade designation "LAPRD"

"THV340Z" was a (50 wt.-% solids) dispersion of a polymer of tetrafluoroethylene, hexafluoropropylene and vinylidene fluoride obtained from 3M Company, St. Paul, Minn. under trade designation "3M™ DYNEON™ FLUOROPLASTIC THV 340Z", reported to have an average particle size of 120 nm, a pH of 9.5, and a melting point of 145° C.

"Lumiflon ZBF500-1" is a water-based fluoropolymer (fluoroethylene vinyl ether copolymer obtained from Dalian Zhenbang Co. (Dalian, China).

"FPN" is an aqueous dispersion of a fluoropolymer (having 32.2 mole % of PMVE, 1.3 mol % of nitrile vinyl ether (NVE) and 66.5 mol % TFE) that can be prepared as described in Example 1 of U.S. Pat. No. 6,943,228. The fluoropolymer has a melting point of 309° C. and the melt flow index (372° C./5 kg) of 2 g/10 min.

"FP1" was a dispersion (35 wt.-% solids) of a fluoropolymer that can be prepared in a similar manner as FPN utilizing the following amounts of monomers: 44 mol % tetrafluoroethylene, 19 mol % hexafluoropropylene and 37 mol % vinylidene fluoride. The fluoropolymer has a melting point of 115° C. and the melt flow index (265° C./5 kg) of 10 g/10 min.

"FP2" was a dispersion (50 wt. %) of a fluoropolymer that can be prepared in a similar manner as FPN utilizing the following amounts of monomers: 48 mol % of tetrafluoroethylene, 20 mole % hexafluoropropylene and 22 mol % vinylidene fluoride. The fluoropolymer has a melting point of 165° C. and the melt flow index (265° C./5 kg) is 9 g/10 min.

A-18—ionic surfactant, obtained from Stepan Company, Northfield, Ill. under the trade designation "POLYSTEP A-18".

Arkema PVDF—a fluoropolymer latex available from Arkema under the trade designation "Kynar Aquatec® ARC latex".

3-glycidoxypropyltrimethoxysilane was obtained from Alfa-Aesar, Ward Hill, Mass.

CX-100 is a polyfunctional aziridine liquid reported to have an equivalent weight of 156 obtained from Royal DSM N. V., Harleen, Netherlands under trade designation "CX-100".

Diazirdine was di(2-propyleniminoethyl)sulfone as described in U.S. Pat. No. 3,235,544.

2-methyl aziridine obtained from Sigma Aldrich Company, St. Louise, Minn.

acryloxypropyl trimethoxysilane obtained from Gelest, Inc., Morrisville, Pa.

Preparation of 2-(2-Methylzairidinyl) Ethylcarboxylpropyltriethoxysilane (Aziridine Alkoxysilane)

Into a 100 mL round bottle flask was placed acryloxypropyl trimethoxysilane (48.8 g, 0.209 mole) and a magnetic stir bar. To the stirred acryloxypropyl trimethoxysilane was added 2-methyl aziridine (90% pure, 14.0 g, 0.23 mole). After addition, the reaction solution was heated at 60° C. for 20 hours. The excess 2-methyl aziridine was removed to give a viscous liquid. Proton NMR was used to analyze the product and confirmed the desired product structure.

Cross Hatch Adhesion Test

The coated samples about 5 cm×5 cm in size on 50 micrometer-thick PET substrates prepared as described below were cut (cross hatched) on their coated side to form about 16 squares using a sharp razor blade. The cut samples were immersed in water at 50° C. overnight. Then the coated samples were removed from water, wiped and an adhesive tape with an aluminum backing available from 3M under the trade designation "(3M-425-DWB)" was stuck on their coated side. The number of squares removed from the coated side of PET substrate with the adhesive tape was recorded to indicate the adhesion quality of the coatings to the PET substrate.

Adhesion to THV610 Film

The described fluoropolymer coated samples were heat laminated to fluoropolymer films comprised of THV 610 having a thickness of 1 mil. The resulting laminated samples were then placed between two PTFE sheets and pressed for 1-1.5 minutes at 160° C. with pressure (50-100 pounds per inch on average) applied between two heated platens of a Wabash Hydraulic press and then the laminates and immediately transferred to a cold press. After cooling to room temperature by a "cold press", the laminates were subjected to water immersion at 50° C. overnight unless indicated otherwise. The strength of adhesion of the coatings described herein to the THV 610 fluoropolymer coating was evaluated using the cross hatch adhesion test. The adhesion peel force was recorded as good, fair, or poor according to the following criteria:
2.4 lbf/inch=good
1.5 lbf/inch=fair
<0.5 lbf/inch=poor Pencil Hardness The surfaces of the coated samples were scratched with an ASTM standard pencil of varying hardness (i.e., 2H, 3H, and so on). The tracks of pencil scratch on the coatings were then examined by a microscope. If the PET was not scratched but was compressed to form the pencil grooves, and the coating is undamaged the test was repeated with another pencil with higher hardness. The highest pencil hardness that the coatings could handle without damage was determined and reported.

Rotary Abrasion

Coated samples were measured for initial transmission and haze prior to testing to provide a baseline value for the test. Coated samples were cut into circles using a 4.075 inch diameter circle cutter (#1817238) and a rolling press setup. The circular samples and were then mounted on a 5155 Dual Rotary Platform Abraser (serial no: 20101135). The rotary abrasion test was conducted with CS10F Abrasion Pads under 500 g weight for 100 cycles at a rate of 60 cycles per minute. The abrasion pads were treated with the grinding stones to ensure they are refreshed before each test sample per standard operation procedure. The samples were then tested for Transmission and Haze after calibrating the transmittance machine for the Rotary Abrasion test area. Transmission and Haze data were recorded and then compared with the initial values. Samples were also checked under a microscope at 50× magnification to determine if the coating has been removed from the substrate.

Surface Modification of the Silica Nanoparticles

The previously described silica nanoparticle dispersions were diluted with water and 3-glycidoxypropyl trimethoxysilane was slowly added at various amounts to obtain 100% coverage of the nanoparticles.

After addition, the solutions were stirred for 48 hrs at room temperature. The solutions were clear or slightly hazy. All the silica nanoparticles and clay utilized in the examples were unmodified (i.e. did not contain a surface treatment) unless indicated otherwise.

Epoxy Modified Clay

Into a 250 ml glass jar was placed 6 g clay and 150 ml of D.I. water. The solution was stirred at room temperature until the clay was completely dispersed into water. To the dispersed solution was added 1.5 g of 3-glycidoxypropyl trimethoxysilane. The solution was stirred at room temperature overnight. All the examples that include clay contained this epoxy modified clay.

Fluoropolymer Coating Preparation

The described fluoropolymer latex dispersions were diluted to 20 wt-% solids or 40 wt-% solids with deionized water. When present, (unmodified or modified) silica nanoparticles were added to the fluoropolymer latex dispersion at the weight ratio of solids described in the tables. Concentrated aqueous ammonium hydroxide was added to adjust the pH value of the mixed dispersion to 9.5-10.0. Subsequently, the described aziridine compounds were added at the amount indicated. The mixed dispersions were coated on PET (wiped with IPA prior to coating) with a #12 Meyer bar unless indicated otherwise. The coated films were heated at 150-160° C. for 10 minutes unless indicated otherwise.

The solutions of the following tables were coated on PET (cleaned by wiping with IPA) with a #12 Meyer bar. The coated PET was heated at 160° C. for 5 minutes.

Improvement in Adhesion of Fluoropolymer Coatings Comprising Aziridine Compound

| Example | Components Wt. % solids | Cross Hatch Adhesion | Film appearance |
|---|---|---|---|
| Comp. A | Lumiflon ZB-F500-1 | 100% removal (1 day) | Hazy |
| 1 | Lumiflon ZB-F500-1/ CX-100 95/5 | 0% removal (3 days) | Clear |
| Comp. B | Arkema PVDF | 100% removal prior to water immersion | |
| 2 | Arkema PVDF/ CX-100 95/5 | Good (after 6 days) | |

Improvement in Adhesion and Hardness of Fluoropolymer Coatings Comprising Aziridine Compound

| | Components weight ratio in grams | Bonding to THV610 Film (2 min at 160° C.) | Pencil Hardness |
|---|---|---|---|
| Comp. C | THV340Z/75 nm SiO$_2$ 70/30 control | NONE-completely peeled off after heating | B |
| 3 | THV340Z/75 nm SiO$_2$ 70/30 + 8 wt-% aziridine alkoxy silane | Excellent Bonding | H |

Fluoropolymer Coatings Comprising Polyaziridine

| Ex. | Components weight ratio in grams | Meyer bar size | Adhesion to THV610 Film | Cross Hatch Adhesion | Coating Thickness (microns) |
|---|---|---|---|---|---|
| 4 | THV340Z/CX-100 5.00:0.15 | #12 | Good | 0 | 1 |
| 5 | THV340Z/CX-100 5.00:0.25 | #12 | Good | 0 | 1 |
| 6 | THV340Z/CX-100/A18 5.00:0.25:0.10 | #12 | Good | 0 | 1 |
| 7 | THV340Z/CX-100 5.00:0.375 | #12 | Good | 0 | 1 |
| 8 | THV340Z/Clay/CX-100 25.00:0.12:0.25 | #12 | Good | 0 | 2-3 |
| 9 | THV340Z/Clay/CX-100 25.00:0.12:0.25 | #24 | Good | 0 | 7-8 |
| 10 | THV340Z/Clay/CX-100 25.00:0.24:0.25 | #12 | Good | 0 | 4-5 |
| 11 | THV340Z/Clay/CX-100 25.00:0.36:0.25 | #24 | Good | 0 | 10-11 |
| 12 | THV340Z/Clay/CX-100 25.00:0.36:0.125 | #12 | Good | 0 | N/M |
| 13 | THV340Z/Clay/Diaziridine 10.00:0.12:0.05 | #12 | Good | 0 | N/M |
| 14 | THV340Z/Clay/CX100/Diaziridine 10.00:0.12:0.02:0.05 | #12 | Good | 0 | N/M |
| 15 | THV340Z/Clay/CX-100/Diaziridine 10.00:0.36:0.05:0.03 | #12 | Good | 0 | N/M |

N/M—Not Measured

The wt-% solids can be calculated by dividing a weight ratio in grams by the total weight and multiplying by 100%. For example, In Ex. 15, the wt-% solids of fluoropolymer (THV340) is 10/(10 + 0.36 + 0.05 + 0.03) × 100% = 96 wt-%.

Fluoropolymer Coatings Comprising Fluoropolymer Blends and Polyaziridine

| Ex. | Components weight ratio in grams | Adhesion to THV610 Film |
|---|---|---|
| 16 | THV 340Z/FP1/CX-100 7.0:3.0;0.05 | Good |
| 17 | THV 340Z/FP1/CX-100 5.0:5.0:0.05 | Good |
| 18 | THV 340Z/FP1/CX-100 3.0:7.0:0.05 | Good |
| 19 | THV 340Z/FP1/CX-100 2.0:8.0:0.05 | Good |
| 20 | THV 340Z/FP1/CX-100 1.0:9.0:0.05 | Good |
| 21 | THV 340Z/FP2/CX-100 7.0:3.0:0.05 | Good |
| 22 | THV 340Z/FP2/CX-100 5.0:5.0:0.05 | Good |
| 23 | THV 340Z/FP2/CX-100 3.0:7.0:0.05 | Good |
| 24 | THV 340Z/FP2/CX-100 2.0:8.0:0.05 | Good |

The following examples demonstrate that good adhesion can be obtained with a variety of surface modified and unmodified nanoparticles ranging in size from 5 to 75 nm. In the following table the surface modified nanoparticle include the designation "M-".

Fluoropolymer Coatings Comprising Unmodified and Modified Silica Nanoparticles and Polyaziridine

| Ex. | Components weight ratio in grams | Adhesion to THV610 Film | Cross Hatch Adhesion |
|---|---|---|---|
| 25 | THV340Z/75 nm SiO$_2$/CX-100 9.00:1.00:0.03 | Good | 0 Pencil Hardness = 2H |
| 26 | THV340Z/75 nm SiO$_2$/CX-100 9.00:1.00:0.05 | Good | 0 |
| 27 | THV340Z/75 nm SiO$_2$/CX-100 9.00:1.00:0.075 | Good | 0 |
| 28 | THV340Z/M-75 nm SiO$_2$/CX-100 9.00:1.00:0.075 | Good | 0 |
| 29 | THV340Z/20 nm SiO$_2$/CX-100 9.00:1.00:0.05 | Good | 0 |
| 30 | THV340Z/M-20 nm SiO$_2$/CX-100 9.00:1.00:0.05 | Good | 0 |
| 31 | THV340Z/5 nm SiO$_2$/CX-100 9.00:1.00:0.05 | Good | 0 |
| 32 | THV340Z/M-5 nm SiO$_2$/CX-100 9.00:1.00:0.05 | Good | 0 |

The formulations in the following table contained 3 wt.-% CX-100 polyaziridine and 3 wt.-% aziridine alkoxysilane. The remaining 94% contained the weight ratio of fluoropolymer and silica nanoparticles as set forth in the table. In the following table the surface modified nanoparticle include the designation "M-". The coated samples were dried at 120-160° C. for 2-5 minutes.

Fluoropolymer Coatings Comprising Polyaziridine and Aziridine Alkoxy Silane

| Ex. | Components weight ratio in grams | Transmission/ Haze before Rotary Abrasion | Transmission/ Haze after Rotary Abrasion | Pencil Hardness |
|---|---|---|---|---|
| 33 | FPN/5 nm SiO$_2$ 50:50 | 91.5/3.1 | 90.7/17.4 | 2 H |
| 34 | FPN/5 nm SiO$_2$ 90:10 | 92.0/4.2 | 91.4/13.6 | 1 H |
| 35 | FPN131/M-5 nm SiO$_2$ 70:30 | 91.8/2.1 | 90.8/6.8 | 2 H |
| 36 | FPN/5 nm & 2 nm SiO$_2$(3/1) 50:50 | 91.9/1.61 | 91.6/5.0 | 3 H |
| 37 | FPN/5 nm & 2 nm SiO$_2$ (3/1) 60:40 | 91.5/3.16 | 91.6/9.91 | 2 H |
| 38 | FPN/5 nm & 2 nm SiO$_2$ (3/1) 70:30 | 91.8/2.08 | 91.7/9.14 | 1 H |
| 39 | FPN/5 nm & 2 nm SiO$_2$ (3/1) 90:10 | 91.7/2.5 | 88.5/33.5 | 1 H |
| 40 | FPN/M-5 nm & M-2 nm SiO$_2$ (3/1) 50/50 | 91.2/7.33 | 90.3/16.8 | 3 H |
| 41 | FPN/M-5 nm & M-2 nm SiO$_2$ (3/1) 60/40 | 90.5/5.71 | 90.8/9.80 | 2 H |
| 42 | FPN/M-5 nm & M-2 nm SiO$_2$ (3/1) 70/30 | 91.7/3.13 | 90.6/8.67 | 2 H |
| 43 | FPN/75 nm SiO$_2$ 70/30 | 91.6/19.1 | 90.6/15.9 | 2 H |
| 44 | FPN/M-5 nm & 2 nm SiO$_2$ (3/1) 70/30 | 91.9/1.99 | 89.9/9.77 | 2 H |
| 45 | FPN | 91.7/8.3 | 80.1/47.7 | F |

What is claimed is:

1. A fluoropolymer coating composition comprising:
an aqueous liquid medium;
fluoropolymer particles dispersed in the aqueous liquid medium, and
at least one aziridine compound comprising or at least one aziridine group and at least one alkoxy silane group having the general structure:

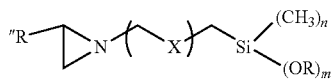

wherein R" is hydrogen or a $C_1$-$C_4$ alkyl;
X is a divalent linking group that contains a carbonyl group;
n is 0, 1 or 2;
m is 1, 2, or 3; and
and the sum or n+m is 3.

2. The fluoropolymer coating composition of claim 1 wherein the aqueous liquid medium is basic.

3. The fluoropolymer coating composition of claim 1 further comprising inorganic oxide nanoparticles.

4. The fluoropolymer coating composition of claim 3 wherein the inorganic oxide nanoparticles comprise silica, clay, or a mixture thereof.

5. The fluoropolymer coating composition of claim 3 wherein the inorganic oxide nanoparticles have an average particle size of less than 100 nm.

6. The fluoropolymer coating composition of claim 1 wherein the fluoropolymer comprises 15 to 35 mole-% of monomeric units derived from VF, VDF or a combination thereof.

7. The fluoropolymer coating composition of claim 1 wherein the fluoropolymer comprises at least 45 mole-% of monomeric units derived from TFE.

8. The fluoropolymer coating composition of claim 6 wherein the fluoropolymer further comprises monomeric units derived from HFP.

9. The fluoropolymer coating composition of claim 1 wherein the fluoropolymer comprises at least 50 mole-% of monmeric units derived from VF, VDF or a combination.

10. The fluoropolymer coating composition of claim 1 wherein the fluoropolymer comprises at least 50 mole-% of monomeric units derived from TFE and repeat units derived from alkyl vinyl ether.

11. The fluoropolymer coating composition of claim 1 wherein the fluoropolymer comprises at least 45 mole-% of monomeric units derived from TFE and monomeric units derived from perfluoroalkyl vinyl ether.

12. The fluoropolymer coating of claim 1 further comprising surfactants, pigments including TiO$_2$, and light stabilizers.

13. A coated substrate comprising a substrate wherein a surface of the coated substrate comprises a dried coating composition according to claim 1.

14. A photovoltaic module comprising a backside film, the backside film comprising:
a substrate wherein a surface of the substrate comprises a dried coating composition according to claim 1.

* * * * *

UNITED STATES PATENT AND TRADEMARK OFFICE
CERTIFICATE OF CORRECTION

PATENT NO. : 9,976,045 B2  
APPLICATION NO. : 14/911852  
DATED : May 22, 2018  
INVENTOR(S) : Naiyong Jing Page 1 of 2

It is certified that error appears in the above-identified patent and that said Letters Patent is hereby corrected as shown below:

In the Specification

Column 3
Line 51, After "CF3" insert -- . --.

Column 5
Line 33, Delete "negligiable" and insert -- negligible --, therefor.

Column 6
Line 66, Delete "ration" and insert -- ratio --, therefor.

Column 8
Line 2, Delete "is" and insert -- in --, therefor.
Line 62, Delete "FLUROPOLYMER" and insert -- FLUOROPOLYMER --, therefor.

Column 9
Line 40 (Approx.), Delete "polyazirdine" and insert -- polyaziridine --, therefor.
Line 57 (Approx.), Before "the sum" delete "and".
Line 57 (Approx.), Delete "or" and insert -- of --, therefor.

Column 10
Line 30, Delete "Al2O3," and insert -- $Al_2O_3$, --, therefor.
Line 64, Delete "3-glycidoxylpropyl" and insert -- 3-glycidoxypropyl --, therefor.

Column 16
Line 54, Delete "Diazirdine" and insert -- Diaziridine --, therefor.
Line 61, Delete "(2-Methylzairidinyl)" and insert -- (2-Methylaziridinyl) --, therefor.

Column 19
Line 57 (Approx.), Delete "CX100" and insert -- CX-100 --, therefor.

Signed and Sealed this  
Eleventh Day of June, 2019

Andrei Iancu  
*Director of the United States Patent and Trademark Office*

In the Claims

Column 21
Line 45, In Claim 1, Delete "or" and insert -- of --, therefor.

Column 22
Line 7 (Approx.), In Claim 1, before "the sum" delete "and".
Line 7 (Approx.), Delete "or" and insert -- of --, therefor.
Line 33 (Approx.), In Claim 9, delete "monmeric" and insert -- monomeric --, therefor.